(12) United States Patent
Zhou et al.

(10) Patent No.: US 11,966,298 B2
(45) Date of Patent: Apr. 23, 2024

(54) DATA BACKUP METHOD AND DATA RECOVERY METHOD FOR NVDIMM, NVDIMM CONTROLLER, AND NVDIMM

(71) Applicant: XI'AN UNIIC SEMICONDUCTORS CO., LTD., Xi'an (CN)

(72) Inventors: Xiaofeng Zhou, Xi'an (CN); Xiping Jiang, Xi'an (CN)

(73) Assignee: XI'AN UNIIC SEMICONDUCTORS CO., LTD., Xi'an (CN)

( * ) Notice: Subject to any disclaimer, the term of this patent is extended or adjusted under 35 U.S.C. 154(b) by 409 days.

(21) Appl. No.: 17/419,609

(22) PCT Filed: Dec. 24, 2019

(86) PCT No.: PCT/CN2019/127883
§ 371 (c)(1),
(2) Date: Jun. 29, 2021

(87) PCT Pub. No.: WO2020/135412
PCT Pub. Date: Jul. 2, 2020

(65) Prior Publication Data
US 2022/0083424 A1 Mar. 17, 2022

(30) Foreign Application Priority Data
Dec. 29, 2018 (CN) .......................... 201811641838.3

(51) Int. Cl.
*G06F 12/00* (2006.01)
*G06F 3/06* (2006.01)
*G06F 11/14* (2006.01)

(52) U.S. Cl.
CPC ........ *G06F 11/1448* (2013.01); *G06F 3/0604* (2013.01); *G06F 3/0655* (2013.01); *G06F 3/0679* (2013.01)

(58) Field of Classification Search
CPC .. G06F 11/1448; G06F 3/0604; G06F 3/0655; G06F 3/0679
See application file for complete search history.

(56) References Cited

U.S. PATENT DOCUMENTS 8,260,992 B2 * 9/2012 Dearth ................ G06F 13/4234
713/320
8,930,647 B1 1/2015 Smith
(Continued)

FOREIGN PATENT DOCUMENTS

| CN | 104375959 A | 2/2015 |
| CN | 107481746 A | 12/2017 |

(Continued)

OTHER PUBLICATIONS

Mar. 23, 2020, International Search Report for International Patent Application No. PCT/CN2019/127883.
(Continued)

*Primary Examiner* — John A Lane
(74) *Attorney, Agent, or Firm* — Clements Bernard Walker; Christopher L. Bernard

(57) ABSTRACT

The present application provides a data backup method and a restoration method for an NVDIMM, an NVDIMM controller and an NVDIMM. The NVDIMM (200) comprises a DRAM (201), a NAND flash memory (202) and an NVDIMM controller (100), the NVDIMM controller (100) controlling the NVDIMM (200) and comprising a DDR controller (101), a NAND flash memory controller (102), a data backup module (103) and a data restoration module (104), the DDR controller (101) using and enabling DBI mechanism. During data backup, the DDR controller (101) reads N-bit $DQ_i$ and 1-bit DBI from the DRAM (201) and sends the same to the data backup module (103). When $DBI_i$ is "1", the data backup module (103) compares the $DQ_i$ and $DQ_{i-1}$. If the number of bits of the $DQ_i$ and the $DQ_{i-1}$ with
(Continued)

different values is greater than N/2, then the $DQ_i$ is inverted and the $DBI_i$ is set to "0", and otherwise the $DQ_i$ and the $DBI_i$ are remained unchanged. When the $DBI_i$ is "0", the $DQ_i$ and the $DBI_i$ are remained unchanged. The data backup module (103) sends the processed $DQ_i$ and $DBI_i$ to the NAND flash memory controller (102), which then writes the processed $DQ_i$ and $DBI_i$ into the NAND flash memory (202).

18 Claims, 2 Drawing Sheets

(56) References Cited

U.S. PATENT DOCUMENTS

| | | | |
|---|---|---|---|
| 10,621,116 B2* | 4/2020 | Brief | G11C 7/1006 |
| 2004/0199368 A1* | 10/2004 | Bechhoefer | G01N 29/46 |
| | | | 703/7 |
| 2007/0115733 A1* | 5/2007 | Jang | G11C 7/1051 |
| | | | 365/189.07 |
| 2013/0091327 A1 | 4/2013 | Shido et al. | |
| 2015/0261446 A1 | 9/2015 | Lee | |
| 2018/0059943 A1 | 3/2018 | Lueker-Boden et al. | |
| 2018/0335828 A1* | 11/2018 | Chun | G06F 1/3234 |
| 2019/0178078 A1* | 6/2019 | Sakiyama | E21B 47/18 |
| 2020/0097683 A1* | 3/2020 | Weidele | G11C 11/005 |

FOREIGN PATENT DOCUMENTS

| | | |
|---|---|---|
| CN | 107533509 A | 1/2018 |
| CN | 107636600 A | 1/2018 |
| CN | 107861901 A | 3/2018 |
| CN | 108153403 A | 6/2018 |
| CN | 109582507 A | 4/2019 |
| CN | 209803777 U | 12/2019 |

OTHER PUBLICATIONS

Document cited in the Corresponding China National Intellectual Property Administration concerning the Chinese priority application CN2018116418383.

* cited by examiner

DATA BACKUP METHOD AND DATA RECOVERY METHOD FOR NVDIMM, NVDIMM CONTROLLER, AND NVDIMM

TECHNICAL FIELD

The present application relates to the field of non-volatile memory, and in particular to a low-power data backup method and data restoration method for a Non-Volatile Dual In-line Memory Module (NVDIMM), an NVDIMM controller and an NVDIMM.

BACKGROUND ART

NVDIMM is a non-volatile memory, including a DRAM, a NAND flash memory (NAND Flash) and an NVDIMM controller. When a motherboard/CPU is abnormal or powered down, the NVDIMM controller is notified through interruptions or messages, and then the NVDIMM controller backs up the data in a DRAM to a NAND flash memory. Thereafter, when the motherboard/CPU is powered up again, it notifies the NVDIMM controller to restore the data backed up in the NAND flash memory to the DRAM, and charge supercapacitors. During data backup, the NVDIMM is powered by supercapacitors; nevertheless, the power supply capability of supercapacitors is limited and is largely attenuated as the service time and operating temperature increase. For an NVDIMM, the power consumption of data backup and the time of data backup/restoration are two important product performance indicators, which determine the capacity and reliability of supercapacitors and the cost of product. The increase in power consumption of data backup inevitably requires an increase in the capacity of supercapacitors for compensation, while the increase in the capacity of supercapacitors may increase the cost and reduce the reliability; additionally, the data backup/restoration time determines the power consumption and user experience during data backup. Therefore, a low-power and fast NVDIMM data backup and restoration method can significantly improve the competitiveness of product.

For an NVDIMM controller of DDR4, power consumption mainly comes from the interfaces of DDR and NAND. In the prior art, use of Data Bus Inversion (DBI) mechanism on the DDR interface side can reduce power consumption by about 25-40%. Because the NAND flash memory interface does not provide the signal of data inversion, it is difficult to reduce power consumption of the NAND interface. The NAND flash memory usually works at 1.8V (version lower than ONFI4.0), and is the main source of the power consumption of NVDIMM controller interface.

Chinese Patent Publication CN107861901A discloses a storage method and system based on NVDIMM-F. The method comprises sending data to be stored to the NVDIMM-F when the CPU receives the data to be stored; storing the data to be stored by the NVDIMM-F. By directly storing the data to be stored in the NVDIMM-F, the method provided by the invention greatly improves the transmission rate of the data to be stored. The method, however, only relates to the operation of storing data in a NAND by an NVDIMM, and does not relate to how to perform a low-power design on the NAND interface according to the characteristics of operation data so as to reduce the power consumption of the NAND interface.

SUMMARY OF THE INVENTION

The present application is directed to an NVDIMM controller of a DDR using DBI mechanism, wherein during data backup, the NVDIMM controller, according to the characteristics of the DDR data (DBI enable), inverts data when the DBI signal is not inverted and the adjacent DDR data conform to the inversion rules after being compared with each other, so as to reduce power consumption of the NAND interface. Optionally, the DDR data and the DBI signal are encoded and arranged in a certain format during data backup, thereby improving the rate of data restoration. The application can solve the following problems of the NVDIMM controller of the DDR using the DBI mechanism:

a) reducing the power consumption of the NAND interface;
b) improving data restoration rate.

According to a first aspect of the present application, there is provided a data backup method for an NVDIMM, the NVDIMM comprising a DRAM, a NAND flash memory and an NVDIMM controller, the NVDIMM controller controlling the NVDIMM and comprising a DDR controller, a NAND flash memory controller and a data backup module, wherein the DRAM adopts and enables DBI mechanism, the data backup method comprising:

reading, by the DDR controller, N-bit $DQ_i$ and 1-bit $DBI_i$ from the DRAM and sending the same to the data backup module, comparing, by the data backup module, the $DQ_i$ with $DQ_{i-1}$ when the $DBI_i$ is "1", if the number of bits of the $DQ_i$ and the $DQ_{i-1}$ with different values is greater than N/2, inverting the $DQ_i$ and setting the $DBI_i$ to "0", and otherwise maintaining the $DQ_i$ and the $DBI_i$ unchanged; maintaining the $DQ_i$ and the $DBI_i$ unchanged when the $DBI_i$ is "0", sending, by the data backup module, the processed $DQ_i$ and $DBI_i$ to the NAND controller, and writing, by the NAND controller, the processed $DQ_i$ and $DBI_i$ into the NAND flash memory.

According to a preferred embodiment of the first aspect of the present application, wherein the data backup module arranges the order of the $DQ_i$ and the $DBI_i$ with a page of the NAND flash memory as a unit.

According to a preferred embodiment of the first aspect of the present application, wherein the DRAM is DDR4.

According to a preferred embodiment according to the first aspect of the present application, wherein the DRAM is DDR4×8 or DDR4×16. Those skilled in the art should appreciate that the number N of bits of the $DQ_i$ can be an integer multiple of 8.

According to a second aspect of the present application, there is provided a data restoration method for an NVDIMM, the NVDIMM comprising a DRAM, a NAND flash memory and an NVDIMM controller, the NVDIMM controller controlling the NVDIMM and comprising a DDR controller, a NAND flash memory controller and a data restoration module, wherein the DRAM adopts and enables DBI mechanism, the data restoration method comprising:

reading, by the NAND controller, N-bit $DQ_i$ and 1-bit $DBI_i$ from the NAND flash memory and sending the same to the data restoration module, judging, by the data restoration module, the values of the $DQ_i$ and the $DBI_i$, if $DBI_i=0$ and the number of "1"s in the $DQ_i$ is less than or equal to N/2, inverting the $DQ_i$ and rewriting the $DBI_i$ to "1" by the data restoration module, and otherwise maintaining the $DQ_i$ and the $DBI_i$ unchanged, sending, by the data restoration module, the processed $DQ_i$ and $DBI_i$ to the DDR controller, and pulling down or pulling up, by the DDR controller, the DBI of the interface of the DDR controller according to the value of the 1-bit $DBI_i$ and sending the $DQ_i$ to the DRAM.

According to a preferred embodiment of the second aspect of the present application, wherein the data restoration module restores the $DQ_i$ and the $DBI_i$ with a page of the NAND flash memory as a unit.

According to a preferred embodiment of the second aspect of the present application, wherein the DRAM is DDR4.

According to a preferred embodiment of the second aspect of the present application, wherein the DRAM is DDR4×8 or DDR4×16. Those skilled in the art should appreciate that the number N of bits of the $DQ_i$ can be an integer multiple of 8.

According to a third aspect of the present application, there is provided an NVDIMM controller, the NVDIMM controller comprises a DDR controller and a NAND flash memory controller, and is used to control an NVDIMM, the NVDIMM comprising a DRAM and a NAND flash memory, wherein the DRAM adopts DBI mechanism, characterized in that, the NVDIMM controller further comprises:
a data backup module, which compares $DQ_i$ with $DQ_{i-1}$ when $DBI_i$ is "1", if the number of bits of the $DQ_i$ and the $DQ_{i-1}$ with different values is greater than N/2, inverts the $DQ_i$, and otherwise maintains the $DQ_i$ and the $DBI_i$ unchanged, and which maintains the $DQ_i$ and the $DBI_i$ unchanged when the $DBI_i$ is "0"; and a data restoration module, which judges the values of $DQ_i$ and $DBI_i$ received from the NAND flash memory controller, if $DBI_i=0$ and the number of "1"s in the $DQ_i$ is less than or equal to N/2, inverts the $DQ_i$ and rewrites the $DBI_i$ to "1", and otherwise maintains the $DQ_i$ and the $DBI_i$ unchanged.

According to a preferred embodiment of the third aspect of the present application, wherein the data backup module arranges the order of the $DQ_i$ and the $DBI_i$ with a page of the NAND flash memory as a unit.

According to a preferred embodiment of the third aspect of the present application, wherein the data restoration module restores the $DQ_i$ and the $DBI_i$ with the page of the NAND flash memory as a unit.

According to a preferred embodiment of the third aspect of the present application, wherein the DRAM is DDR4.

According to a preferred embodiment of the third aspect of the present application, wherein the DRAM is DDR4×8 or DDR4×16. Those skilled in the art should appreciate that the number N of bits of the $DQ_i$ can be an integer multiple of 8.

According to the fourth aspect of the present application, there is provided an NVDIMM, the NVDIMM comprising the NVDIMM controller according to the third aspect mentioned above.

DESCRIPTION OF THE FIGURES

The present application will be better understood through the following detailed description in conjunction with the figures. It should be understood that these figures are for illustrative purpose only and are not necessarily drawn in scale. In the figures.

DETAILED DESCRIPTION

According to the present application, an NVDIMM controller achieves the non-volatile function mainly by a DDR controller, a NAND flash memory controller and a data backup/restoration module, the three of which are implemented using FPGA or ASIC. The present application is directed to DDR that uses DBI mechanism. Unless otherwise noted, DDR herein refers to DDR4; nevertheless, it should be understood that the present application is not limited to DDR4, and is also applicable to other existing and future DDR versions that support DBI mechanism.

Figure 1:
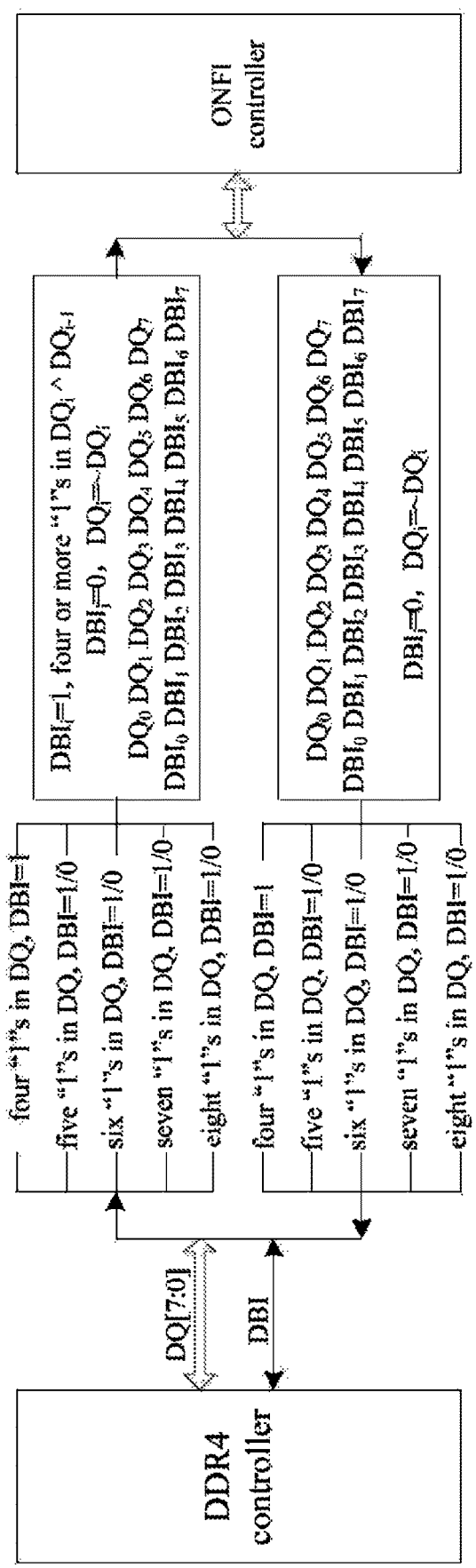
FIG. 1 is a system block diagram of an NVDIMM controller according to an embodiment of the present application.

FIG. 1 also shows a data backup and restoration method according to an embodiment of the present application. Taking DDR4×8 as an example, the interface signal related to the DDR controller is 8-bit DQ and 1-bit DBI.

The data backup method of an NVDIMM controller will be described in detail below.

The DDR controller reads data from a DRAM. Due to the DBI mechanism, there are nine possible relationships between the number of "1"s in DQ and the DBI. As shown in Table 1, when DBI is '0', it is indicated that the DQ data is inverted, and otherwise the DQ data is not inverted.

TABLE 1

| Values and relationships between DQ and DBI | | |
|---|---|---|
| DQ[7:0] | DBI | Description |
| four "1"s in DQ | 1 | DQ is not inverted |
| five "1"s in DQ | 1 | DQ is not inverted |
| five "1"s in DQ | 0 | DQ is inverted |
| six "1"s in DQ | 1 | DQ is not inverted |
| six "1"s in DQ | 0 | DQ is inverted |
| seven "1"s in DQ | 1 | DQ is not inverted |
| seven "1"s in DQ | 0 | DQ is inverted |
| eight "1"s in DQ | 1 | DQ is not inverted |
| eight "1"s in DQ | 0 | DQ is inverted |

A data backup module processes DQ and DBI. For $DQ_i$, if the DBI of the $DQ_i$ is 1, the data backup module will compare the $DQ_i$ with $DQ_{i-1}$ and detect the number of bits of the $DQ_i$ and the $DQ_{i-1}$ with different values. If the number of bits with different values is greater than N/2, wherein the number of bits of DQ is N, then the data backup module inverts the $DQ_i$ and sets the DBI of the $DQ_i$ to "0". If the number of bits with different values is less than or equal to N/2, then the data backup module maintains the $DQ_i$ and the $DBI_i$ unchanged. If the DBI of the DQ is "0", then the data backup module does not compare the $DQ_i$ with the $DQ_{i-1}$ and maintains the $DQ_i$ and the $DBI_i$ unchanged. The data backup module will send the processed DQ and DBI to a NAND controller, and write the processed DQ and DBI into a NAND flash memory by means of the NAND controller to complete data backup. Herein, the number N of bits of DQ can be an integer multiple of 8.

When the data backup module processes DQ and $DBI_i$ it can take a page of NAND flash memory as a unit. Take a page with a size of 9 KB as an example, 8 KB DQ and 1 KB DBI are read from a DDR interface, and the DQ and the DBI are organized in the following format:
$DQ_0DQ_1DQ_2DQ_3DQ_4DQ_5DQ_6DQ_7DBI_0DBI_1DBI_2DBI_3DBI_4DBI_5DBI_6DBI_7$.

It should be understood that the $DQ_i$ is 8 KB in size and the $DBI_i$ is 1 KB in size. In addition, it should be understood that any other suitable formats may be used.

The data restoration method of the NVDIMM controller is as follows:

The NAND controller reads DQ and DBI from a NAND flash memory and sends the same to a data restoration module. The decoding rule of the data restoration module is as follows: if $DBI_i=0$ and the number of "1"s in the corresponding $DQ_i$ is less than or equal to 4, then the data restoration module inverts the $DQ_i$ and rewrites the $DBI_i$ to "1", and otherwise maintains the $DQ_i$ and the $DBI_i$ unchanged; if $DBI_i=0$ and the number of "1"s in the corresponding $DQ_i$ is greater than 4, or if $DBI_i=1$, then the data restoration module maintains the $DQ_i$ and the $DBI_i$ unchanged. Then, the data backup and restoration modules, according to DBI rules, write DQ into the DRAM by means of the DDR controller.

When the data backup module processes the DQ and the DBI with a page of the NAND flash memory as a unit, it reads and backs up the written data with the page as a unit, and parses the data according to the written format to obtain the DQ and DBI stored in the NAND flash memory.

Figure 2:
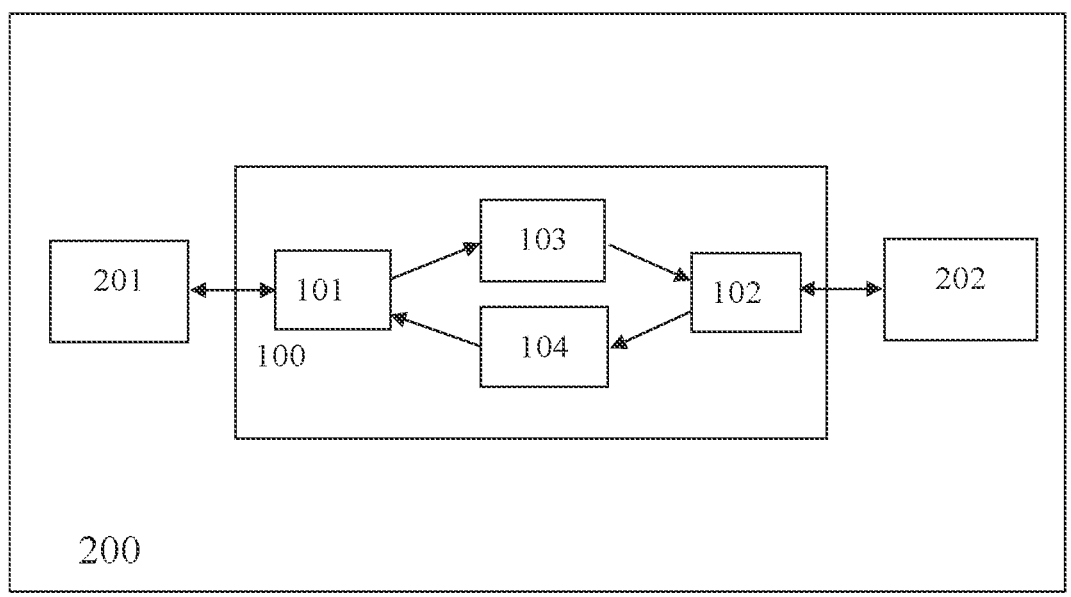
FIG. 2 is a schematic diagram of an NVDIMM according to an embodiment of the present application.

FIG. 2 is a schematic diagram of an NVDIMM according to an embodiment of the present application. As shown in FIG. 2, an NVDIMM controller 100 comprises a DDR controller 101, a NAND flash memory controller 102, a data backup module 103, and a data restoration module 104. The NVDIMM controller controls an NVDIMM 200 including a DRAM 201 and a NAND flash memory 202, and the data backup and restoration modules implement the data backup method and the data restoration method described above with respect to FIG. 1. The DDR controller is coupled to the DRAM. The NAND flash memory controller is coupled to the NAND flash memory. The data backup module is coupled to the DDR controller and the NAND flash memory controller, and the data restoration module is coupled to the DDR controller and the NAND flash memory controller.

It should be understood that these embodiments are only for illustrative purpose, those skilled in the art can make many variations, and the scope of the present application is defined by the claims.

What is claimed is:

1. A data backup method for an NVDIMM, the NVDIMM comprising a DRAM, a NAND flash memory and an NVDIMM controller, the NVDIMM controller controlling the NVDIMM and comprising a DDR controller, a NAND flash memory controller and a data backup module, wherein the DRAM adopts and enables Data Bus Inversion (DBI) mechanism, the data backup method comprising:

reading, by the DDR controller, N-bit Data Queue (DQ)i and 1-bit DBIi from the DRAM and sending the same to the data backup module, wherein N is an integer multiple of 8;

comparing, by the data backup module, the DQi and DQi−1 when the DBIi is "1", if the number of bits of the DQi and the DQi−1 with different values is greater than N/2, inverting the DQi and setting the DBIi to "0", and otherwise maintaining the DQi and the DBIi unchanged; maintaining the DQi and the DBIi unchanged when the DBIi is "0", sending, by the data backup module, processed DQi and DBIi to the NAND controller, and writing, by the NAND controller, the processed DQi and DBIi into the NAND flash memory.

2. The data backup method according to claim 1, wherein the data backup module arranges the order of the DQi and the DBIi with a page of the NAND flash memory as a unit.

3. The data backup method according to claim 2, wherein the DRAM is DDR4.

4. The data backup method according to claim 3, wherein the DRAM is DDR4×8 or DDR4×16.

5. The data backup method according to claim 1, wherein the DRAM is DDR4.

6. The data backup method according to claim 5, wherein the DRAM is DDR4×8 or DDR4×16.

7. A data restoration method for an NVDIMM, the NVDIMM comprising a DRAM, a NAND flash memory and an NVDIMM controller, the NVDIMM controller controlling the NVDIMM and comprising a DDR controller, a NAND flash memory controller and a data restoration module, wherein the DRAM adopts and enables Data Bus Inversion (DBI) mechanism, the data restoration method comprising:

reading, by the NAND controller, N-bit Data Queue (DQ)i and 1-bit DBIi from the NAND flash memory and sending the same to the data restoration module, wherein N is an integer multiple of 8;

judging, by the data restoration module, the values of the DQi and the DBIi, if DBIi=0 and the number of "1"s in the DQi is less than or equal to N/2, inverting the DQi and rewriting the DBIi to "1" by the data restoration module, and otherwise maintaining the DQi and the DBIi unchanged, sending, by the data restoration module, processed DQi and DBIi to the DDR controller, and pulling down or pulling up, by the DDR controller, the DBI of the interface of the DDR controller according to the value of the 1-bit DBIi and sending the DQi to the DRAM.

8. The data restoration method according to claim 7, wherein the data restoration module restores the DQi and the DBIi with a page of the NAND flash memory as a unit.

9. The data restoration method according to claim 8, wherein the DRAM is DDR4.

10. The data restoration method according to claim 9, wherein the DRAM is DDR4×8 or DDR4×16.

11. The data restoration method according to claim 7, wherein the DRAM is DDR4.

12. The data restoration method according to claim 11, wherein the DRAM is DDR4×8 or DDR4×16.

13. An NVDIMM controller, the NVDIMM controller comprises a DDR controller and a NAND flash memory controller and is used to control an NVDIMM, the NVDIMM comprising a DRAM and a NAND flash memory, wherein the DRAM adopts Data Bus Inversion (DBI) mechanism, characterized in that, the NVDIMM controller further comprises:

a data backup module, which compares Data Queue (DQ)i with DQi−1 when DBIi is "1", if the number of bits of DQi and DQi−1 with different values is greater than N/2, inverts the DQi and otherwise maintains the DQi and the DBIi unchanged, and which maintains the DQi and the DBIi unchanged when the DBIi is "0", wherein N is an integer multiple of 8; and a data restoration module, which judges the values of DQi and DBIi received from the NAND flash memory controller, if DBIi=0 and the number of "1"s in the DQi is less than or equal to N/2, inverts the DQi and rewrites the DBIi to "1", and otherwise maintains the DQi and the DBIi unchanged.

14. The NVDIMM controller according to claim 13, wherein the data backup module arranges the order of the DQi and the DBIi with a page of the NAND flash memory as a unit.

15. The NVDIMM controller according to claim 14, wherein the data restoration module restores the DQi and the DBIi with the page of the NAND flash memory as a unit.

16. The NVDIMM controller according to claim 14, wherein the DRAM is DDR4.

17. The NVDIMM controller according to claim 16, wherein the DRAM is DDR4×8 or DDR4×16.

18. An NVDIMM, comprising the NVDIMM controller as claimed in claim 13.

* * * * *